United States Patent
Behrens et al.

(10) Patent No.: US 9,123,764 B2
(45) Date of Patent: Sep. 1, 2015

(54) METHOD OF MANUFACTURING A COMPONENT COMPRISING CUTTING A CARRIER

(75) Inventors: Thomas Behrens, Wenzenbach (DE); Joachim Mahler, Regensburg (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 13/594,711

(22) Filed: Aug. 24, 2012

(65) Prior Publication Data

US 2014/0057396 A1 Feb. 27, 2014

(51) Int. Cl.
- *H01L 21/30* (2006.01)
- *H01L 21/683* (2006.01)
- *H01L 21/78* (2006.01)
- *H01L 23/00* (2006.01)
- *H01L 21/67* (2006.01)

(52) U.S. Cl.
CPC ............ *H01L 21/6836* (2013.01); *H01L 21/78* (2013.01); *H01L 24/27* (2013.01); *H01L 24/29* (2013.01); *H01L 21/67092* (2013.01); *H01L 21/67132* (2013.01); *H01L 2224/27003* (2013.01); *H01L 2224/2745* (2013.01); *H01L 2224/27436* (2013.01); *H01L 2224/27462* (2013.01); *H01L 2224/27848* (2013.01); *H01L 2224/29294* (2013.01); *H01L 2224/29309* (2013.01); *H01L 2224/29311* (2013.01); *H01L 2224/29313* (2013.01); *H01L 2224/29318* (2013.01); *H01L 2224/83856* (2013.01); *H01L 2224/94* (2013.01); *H01L 2224/97* (2013.01); *H01L 2924/1301* (2013.01); *H01L 2924/1305* (2013.01); *H01L 2924/13055* (2013.01); *H01L 2924/13091* (2013.01); *Y10T 83/0448* (2015.04)

(58) Field of Classification Search
CPC .......... H01L 21/30; H01L 21/46; H01L 23/00
See application file for complete search history.

(56) References Cited

U.S. PATENT DOCUMENTS

| | | | |
|---|---|---|---|
| 7,723,839 B2 | 5/2010 | Yano et al. | |
| 2007/0200250 A1* | 8/2007 | Koenigsberger et al. | 257/778 |
| 2011/0031602 A1* | 2/2011 | Wowra et al. | 257/690 |
| 2011/0297980 A1* | 12/2011 | Sugizaki et al. | 257/98 |
| 2013/0215583 A1* | 8/2013 | Vincent | 361/760 |

FOREIGN PATENT DOCUMENTS

DE 102010017768 A1 2/2011

\* cited by examiner

*Primary Examiner* — Jae Lee
(74) *Attorney, Agent, or Firm* — Slater & Matsil, L.L.P.

(57) ABSTRACT

A method of manufacturing a component is disclosed. An embodiment of the method comprises dicing a carrier in a plurality of components, the carrier being disposed on a support carrier, after dicing, placing a connection layer on the carrier and removing the components from the support carrier.

20 Claims, 6 Drawing Sheets

METHOD OF MANUFACTURING A COMPONENT COMPRISING CUTTING A CARRIER

TECHNICAL FIELD

The present invention relates generally to fabrication of components and, more particularly, to a method of cutting a carrier.

BACKGROUND

Chips are manufactured by a plurality of processing steps including a wafer cutting step. The manufacturing and cutting process may create or cause die-cracks or chipping in the singulated chips.

SUMMARY OF THE INVENTION

In accordance with an embodiment of the present invention, a method for manufacturing a component comprises dicing a carrier in a plurality of components, the carrier being disposed on a support carrier, after dicing, placing a connection layer on the carrier and removing the components from the support carrier.

In accordance with an embodiment of the present invention, a method of manufacturing a semiconductor device comprises placing a wafer with its front side on a dicing foil, separating the wafer into chips, the chips being separating by spaces, placing a solder paste, an adhesive conductive paste or a nano paste on the wafer. The method further comprises stretching the dicing foil and picking up the chips from the dicing foil.

In accordance with an embodiment of the present invention, a method of manufacturing a chip comprises placing a wafer on a dicing foil, wherein the wafer comprises a front side and a back side, and wherein the wafer is placed with the front side on the dicing foil, and dicing the wafer forming gaps and chips. The method further comprises forming a photoresist on the wafer, patterning the photoresist such that the photoresist remains on the gaps and forming a solder layer on the wafer. The method finally comprises removing the remaining photoresist and picking up the semiconductor device from the dicing foil.

In accordance with an embodiment of the present invention, a method of manufacturing a packaged component comprises placing a wafer on a dicing foil, separating the wafer into components, the components being separated by spaces, and after separating, placing an electrical contact layer on the wafer. The method further comprises picking up a component from the dicing foil, placing the component on a component carrier, bonding a first contact pad of the component to a first component carrier contact pad and encapsulating the component.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a method of manufacturing semiconductor chips. Embodiments of the invention may also be applied, however, to other methods of manufacturing components.

A problem with sawing wafer having substrate thickness of about 100 μm or less and a solder material disposed thereon is that the sawing process can lead to cracks and break outs of the solder material and/or the chip substrate.

An embodiment of the invention comprises forming a connection layer on a carrier after dicing the carrier. The connection layer may be a conductive layer or an insulating layer. For example, the connection layer may be a component attach paste or a solder layer. In one embodiment the component attach paste is pre-cured on the diced carrier.

An embodiment of the invention comprises patterning a photoresist on the diced carrier such that the spaces between the components are covered and forming a metal layer on the diced carrier.

An advantage of these embodiments is that the wafer/chips and the connection layer disposed thereon do not crack when cut. A further advantage is that the material of the connection layer does not flow or move to other parts of the wafer/chip when cut.

Figure 1:
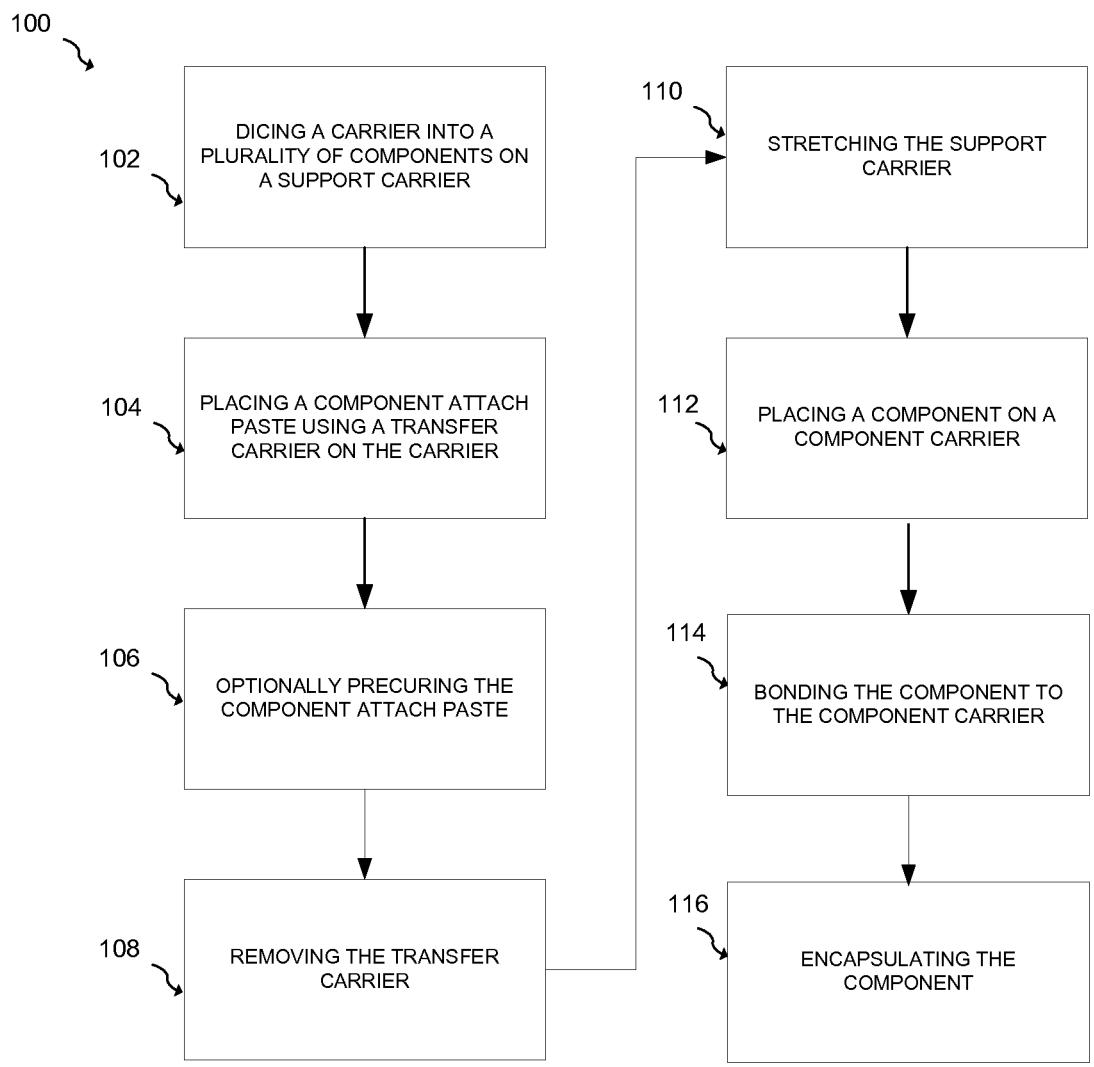
FIG. 1 shows a flow chart of an embodiment of a method for manufacturing a packaged component.
Figure 2A:
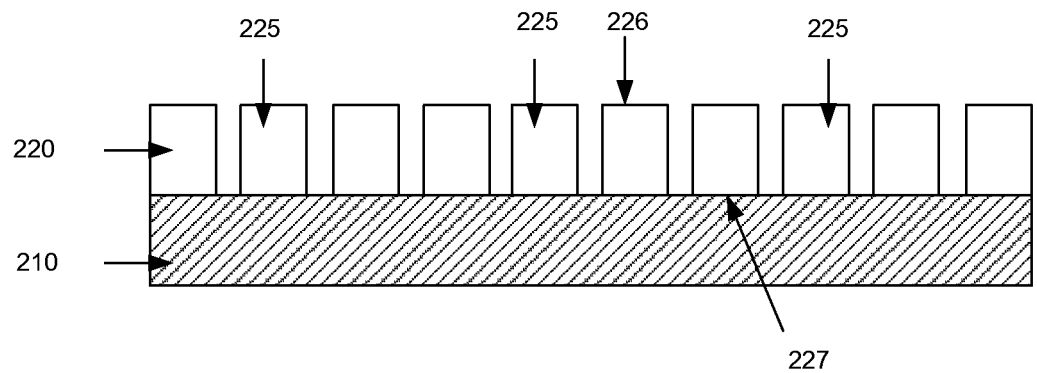
FIGS. 2a-2c show embodiments of several stages in the manufacturing process.

FIG. 1 shows an embodiment of a method for manufacturing en electric component 100. In a first step 102, a carrier is diced into a plurality of components. The carrier is diced into a plurality of components using a cutting instrument such as a dicing saw or a dicing laser. The carrier is placed on a support carrier such as a dicing foil before diced. FIG. 2a shows an embodiment of a diced carrier 220 disposed on a support carrier 210. The diced carrier 220 comprises a plurality of components 225. The carrier 220 is glued to the support carrier 210 and the cutting lines caused by the dicing saw or dicing laser may cut partially in the support carrier 210 (not shown).

The diced carrier 220 comprises a first main surface or top surface 226 and a second main surface or bottom surface 227. The top surface 226 may be the backside of the carrier 220 and the bottom surface may be the front side of the carrier 220. In one embodiment, the second main surface 227 is the surface where the active areas are predominately disposed and the first main surface 226 is the surface which is active area free or which is predominately active area free. A conductive layer may be disposed on the top surface 226 of the diced carrier 220. For example, the conductive layer may be an adhesion layer, a barrier layer, a seed layer or an under-metallization layer. The conductive layer may be a layer stack comprising a plurality and/or a combination of conductive layers.

The diced carrier 220 comprises a substrate. The substrate may be a semiconductor substrate such as silicon or germanium, or a compound substrate such as SiGe, GaAs, InP, GaN or SiC, or alternatively, other materials. The substrate may be doped or undoped and may comprise one or more wells. The substrate may comprise a thickness between about 20 μm and about 60 μm. Alternatively, the substrate may be between about 60 μm and about 100 μm thick. The semiconductor substrate may be a single crystal silicon or a silicon-on insulator (SOI). One or more interconnect metallization layers may be arranged on the substrate. A passivation layer is disposed on the interconnect metallization layers to electrical isolate and structure component contact pads for the components 225.

The diced carrier 220 comprises a plurality of components (e.g., chips or dies) 225. The components 225 may comprise a discrete device such as a single semiconductor device or an integrated circuit (IC). For example, the components 225 may comprise a semiconductor device such as a MOSFET or a power semiconductor device such as a bipolar transistor, an insulated gate bipolar transistor (IGBT), a power MOSFET, a thyristor or a diode. Alternatively, the components 225 may be a resistor, a protective device, a capacitor, a sensor or a detector, for example. The component may be a system on chip (SoC). In one embodiment the component 225 comprises a single device such as a transistor, wherein the top surface 226 comprises a source and the bottom surface 227 comprises a drain. Alternatively, the top surface 226 comprises a drain and the bottom surface 227 comprises a source.

Figure 2B:
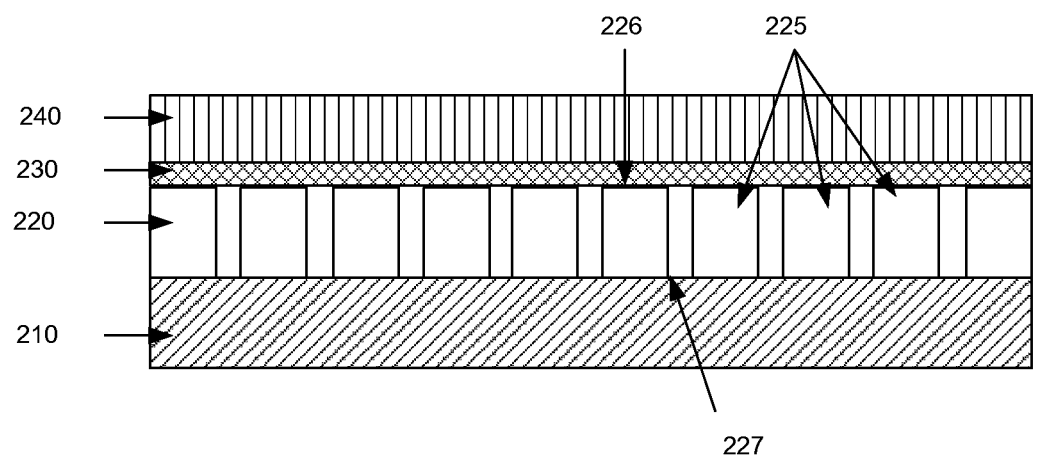

In the next step 104 a component attach paste 230 is applied to the diced carrier 220. For example, the component attach paste 230 is formed on the backside 226 of the diced carrier 220/components 225. In one embodiment the component attach paste 230 is placed on the carrier 220 by placing a transfer carrier 240 with the component attach paste 230 disposed thereon on the diced carrier 220. The transfer carrier 240 may be a transfer foil. Alternatively, the transfer carrier 240 may be a polymer, metal or ceramic foil or strip. This is shown in FIG. 2b.

In one embodiment the component attach paste 230 is placed on the diced carrier 220 without using the transfer carrier 240. For example the component attach paste may be placed on the carrier by dispensing or by printing.

In one embodiment the component attach paste 230 is an adhesive conductive paste such as a solder paste. A solder paste may comprise a powdered metal solder suspended in flux. The adhesive solder paste may comprise eutectic Sn—Pb (e.g., 63% tin (Sn) and 37% lead (Pb)) or a lead-free solder. Alternatively, the adhesive solder paste comprises and SAC (e.g., tin-silver-copper) alloy). In yet another embodiment, the adhesive solder comprises tin-antimony (Sn/Sb), zinc (Zn), indium (In), bismuth (Bi) as the main component, for example.

In one embodiment the component attach paste 230 is a nano paste. The nano paste comprises metallic inks having particles which measure a few tens of nm in size. The particles may be silver (Ag), gold (Au), or copper (Cu). Alternatively, the particles may comprise other metals. The nano pastes may be applied to the diced carrier 220 by an inkjet printer.

In one embodiment the component attach paste 230 is an insulating paste. For example, the insulating paste comprises an epoxy, an acrylic or bismaleimide (BT), a polyimide, a silicon based polymer or combinations thereof. The polymers comprise additives and may be filled with fillers such as $SiO_2$, $Al_2O_3$, or BN.

In one embodiment the component attach paste 230 is a bi-stage material. The bi-stage material may be cured with a first temperature and connected to a component carrier with a second, higher temperature. For example, the bi-stage stage material comprises an epoxy or an acrylic or bismaleimide (BT), a polyimide, a silicon based polymer or combinations thereof.

The component attach paste 230 may comprise a thickness between about 3 μm and about 20 μm or between about 20 μm and about 50 μm. Alternatively, the component attach paste 230 may comprise a thickness of about 50 μm to about 100 μm. The component attach paste 230 may comprise the same thickness as the substrate of the component 225 or may comprise a larger thickness than the substrate of the component 225.

In step 106 the component attach paste 230 is optionally pre-cured. For example, the component attach paste 230 is "B-stable cured" at a temperature between about 80° C. and about 150° C. in order to adhere it to the underlying material (e.g., conductive layer or substrate).

In step 108, the transfer carrier 240 is removed. For example, the transfer foil 240 is pulled off or stripped off from the component attach paste 230.

Figure 2C:
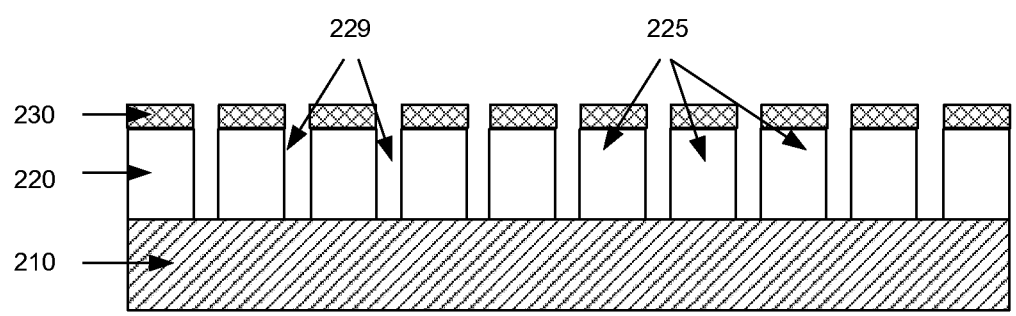

In step 110, the support carrier is stretched and the components disposed thereon are pulled apart. The support carrier is stretched increasing the widths of the cutting lines. The increased width provides more space between the components providing room for picking up the components. When the support carrier is stretched the component attach paste may be separated. For example, the component attach past is severed, separated or torn along the cutting lines so that the component attach past remains on top of the individual components. The severed component attach paste may overhang the components. FIG. 2c shows the support carrier 210 after being stretched or extended. The component attach paste 230 remains on the top surface of the components 225 but is severed or substantially removed over the cutting lines 229.

In step 112 at least one component is placed on a component carrier. The individual components are picked up, flipped and placed on a component attach area of a component carrier. The component carrier may be a substrate, a leadframe or a printed circuit board (PCB).

The components are attached to the component carrier by applying a pressure and temperature. For example, the component attach paste may be heated to a temperature of about 150° C. to about 300° C., or about 220° C. to about 250° C. The temperature is applied with a pressure of about 1 MPa to about 50 MPa for 1-20 min. In one embodiment bond formation between the component and the component carrier occurs by sintering of the nano paste.

In step 114, the bond pad(s) of the component are bonded to component carrier contact pad(s). The component is electrically connected to the component carrier via a conductive wire or a conductive clip. The component contact pad(s) may be bonded to the component carrier contact pads by applying a wire bonding process, a ball bonding process, or a combination thereof.

In step 116 the component is sealed or encapsulated with an encapsulation material. The encapsulation material may comprise a molding compound, a laminate or a casing. The encapsulation material may partially encapsulate the component carrier and completely encapsulate the component. The encapsulation material may completely or partially encapsulate the wires and/or the conductive clips.

The encapsulation material may comprise thermosetting materials such as an epoxy, polyimide, polyurethane or polyacryliate compound. Alternatively the encapsulation material may comprise thermoplastic materials such as polysulfones, polyphenylen sulfides, or polyetherimides. In one embodiment the encapsulation material may be a laminate such as a prepreg.

In an optional step the encapsulated component is separated, singulated or cut from other encapsulated components. For example, a plurality of components are placed on a leadframe, bonded and then encapsulated. The leadframe and the encapsulation material are cut with a dicing saw or a dicing laser forming individual encapsulated components.

Figure 3:
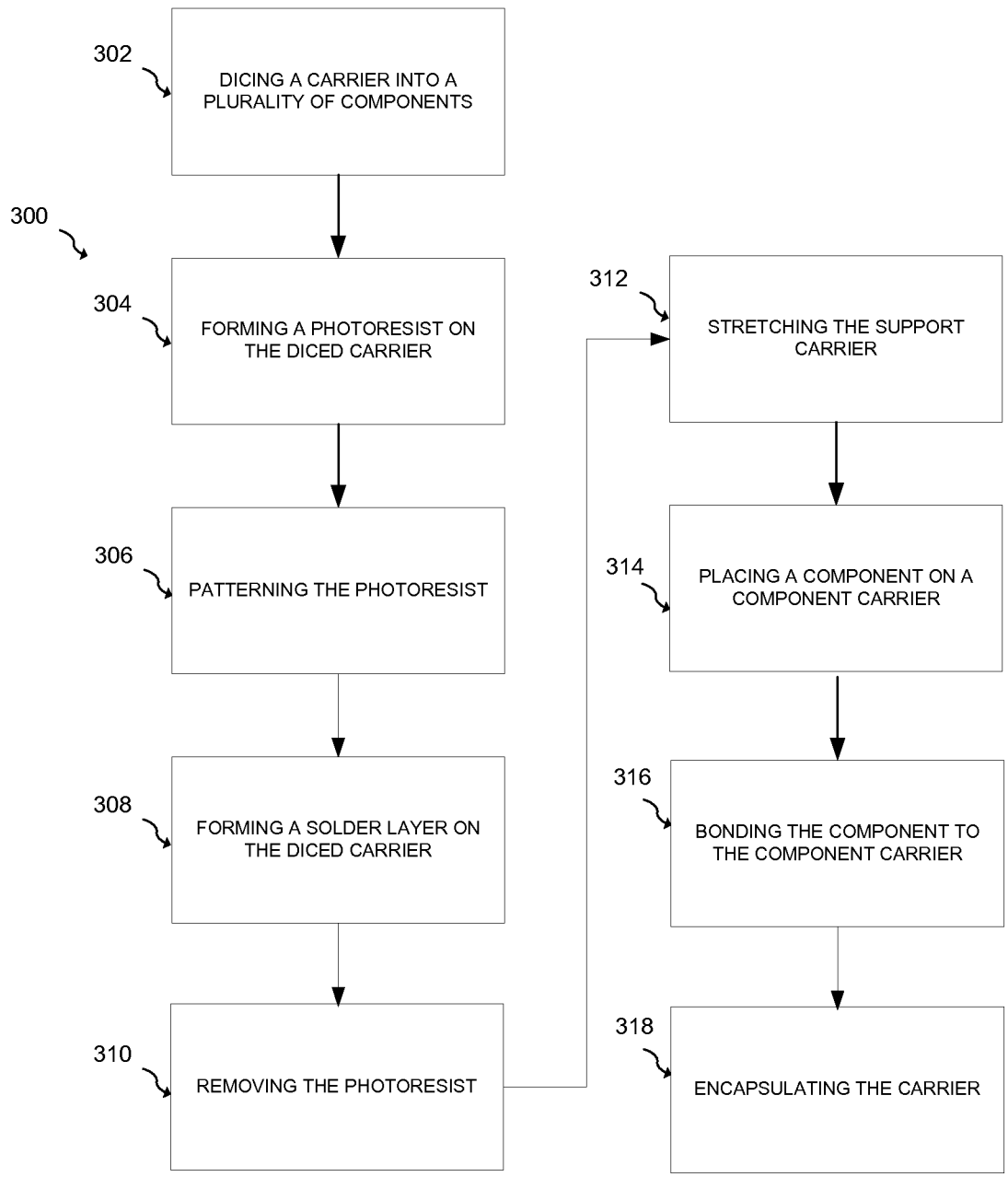
FIG. 3 shows a flow chart of an embodiment of a method for manufacturing a packaged component.

FIG. 3 shows an embodiment of a method for manufacturing en electric component 300. In a first step 302, a carrier is diced into a plurality of components. The carrier is diced into a plurality of components using a cutting instrument such as a dicing saw or a dicing laser. The carrier is placed on a support carrier such as a dicing foil before diced.

The diced carrier may comprise a substrate, interconnect metallization layers and/or a passivation layer having the same or similar materials as described with respect to FIG. 1. Moreover, the components may be the same or similar as the components of FIG. 1.

In step 304 a photoresist is formed on the diced carrier. The photoresist is deposited applying a spin coating process. The photoresist is patterned and developed (step 306). The photoresist is patterned and developed such that the photoresist is removed over the top surface of the components but remains on the cutting lines.

Figure 4A:
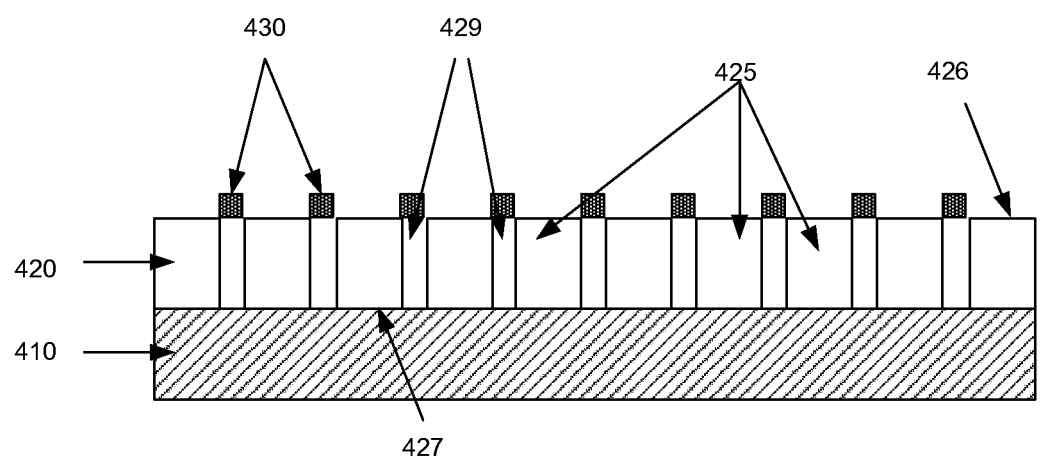
FIGS. 4a-4c show embodiments of several stages in the manufacturing process.

FIG. 4a shows an embodiment of a cross-sectional view of a diced carrier 420 disposed on a support carrier 410. The diced carrier 420 comprises a plurality of components 425. The diced carrier 420 is attached or glued to the support carrier 410 and the cutting lines 429 caused by the dicing saw or dicing laser may cut partially in the support carrier 410 (not shown).

The diced carrier 420 comprises a first main surface or top surface 426 and a second main surface or bottom surface 427. The top surface 426 may be the backside of the diced carrier 420 and the bottom surface may be the front side of the diced carrier 420. In one embodiment, the second main surface 427 is the surface where the active areas are predominately disposed and the first main surface 426 is the surface which is active area free or which is predominately active area free. In another embodiment, the second main surface 427 is the surface where the drain is located and the first main surface 426 is the source and the gate is located or, alternatively, the second main surface 427 is the surface where the source is located and the first main surface 427 is the drain and the gate is located.

A conductive layer may be disposed on the top surfaces 426 of the diced carrier 420. For example, the conductive layer may be an adhesion layer, a barrier layer, a seed layer or an under-metallization layer. The conductive layer may be a layer stack comprising a plurality and/or a combination of conductive layers.

The patterned photoresist 430 is disposed on the cutting lines or the spaces 429 between the components 425. The patterned photoresist 430 may overly the cutting lines 429 and a small portion of the top surface 426 of the components 425, e.g., along the circumferences of the top surfaces 426. For example, the photoresist 430 may cover up to 10% of the area of the top surface 426 of the component 425.

In step 308, a metal layer is formed on top surface of the carrier. In one embodiment the metal layer is a solder layer. For example, the solder layer comprises silver-tin (SnAg), gold-tin (AuSn), or copper-tin (CuSn). The solder layer may comprise eutectic Sn—Pb (e.g., 63% tin (Sn) and 37% lead (Pb)) or a lead-free solder. Alternatively, the solder layer comprises and SAC (e.g., tin-silver-copper) alloys, or tin-antimony (Sn/Sb), zinc (Zn), indium, or bismuth (Bi) as main component, for example. Alternatively, the metal layer may comprise other metals materials.

Figure 4B:
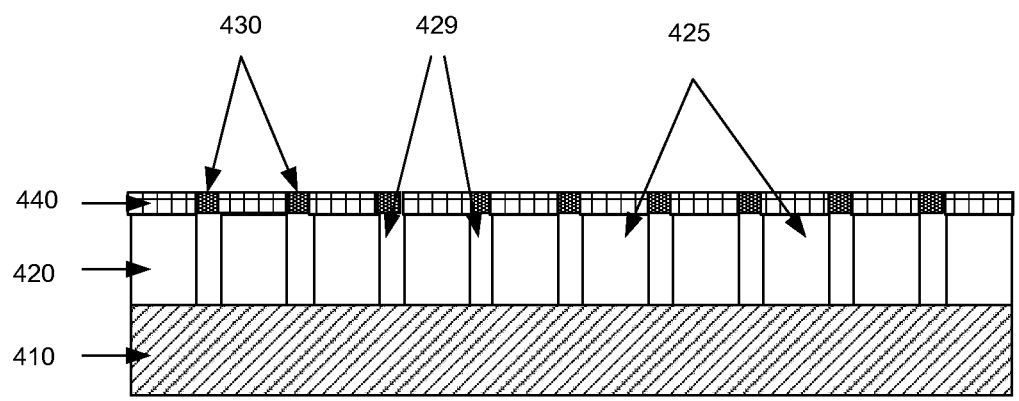

The metal layer may be disposed by sputtering. Alternatively, the metal layer may be disposed by a galvanic process. FIG. 4b shows a diced carrier 420 with the metal layer 440 disposed thereon. The metal layer 440 is disposed between the patterned photoresist 430. The metal layer 440 is formed on the exposed top surface 426 of the components 425. The metal layer is not disposed in the cutting lines 429 between the components 425 because the patterned photoresist 425 prevents the metal of the metal layer to be located in the cutting lines 429.

The metal layer 440 may comprise a thickness between about 20 µm and about 50 µm or between about 50 µm and about 100 µm. The metal layer 440 may comprise the same thickness as the substrate of the component 425 or may comprise a larger thickness than the substrate of the component 425.

In step 310 the photoresist is removed. For example, the photoresist is removed in an ashing process ($O_2$). Alternatively, the photoresist is dissolved applying water ($H_2O$) or an organic solvent such as Cyclopentanone.

Figure 4C:
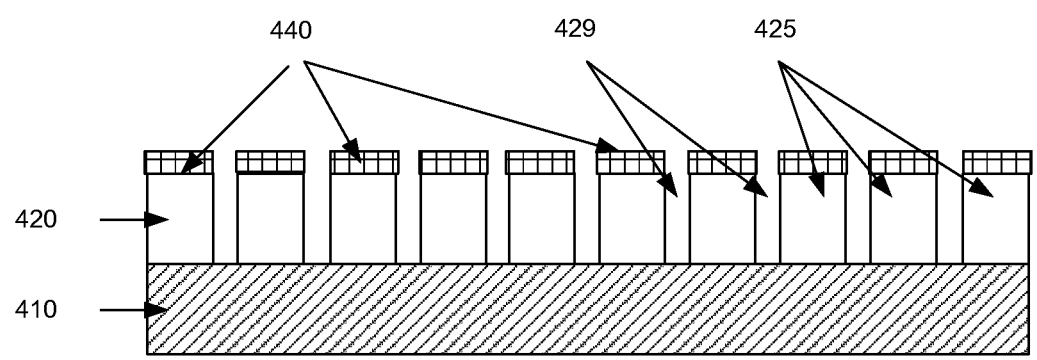

In step 312, the support carrier is stretched and the components disposed thereon are pulled apart. The support carrier is stretched increasing the width of the cutting lines. The increased distance between the components provides space for picking up the components. FIG. 4c shows the support carrier 410 after being stretched or extended. The metal layer 440 remains on the top surface of the components 425.

In step 314 at least one component is placed on a component carrier. The individual components are picked up, flipped and placed on a component attach area of a component carrier. The component carrier may be a substrate, a leadframe or a printed circuit board (PCB).

The components are attached to the component carrier by applying a pressure and temperature. The components may be attached to the component carrier applying a temperature of about 150° C. and more. For example, the components are attached to the component carrier at a temperature between about 220° C. and about 300° C. The pressure applied may be about 10 MPa to about 50 MPa.

In step 316, the bond pad(s) of the component are bonded to component carrier contact pad(s). The component is electrically connected to the component carrier via a conductive wire or a conductive clip. The component contact pad(s) may be bonded to the component carrier contact pads by applying a wire bonding process, a ball bonding process, or a combination thereof.

In step 318 the component is sealed or encapsulated with an encapsulation material. The encapsulation material may comprise a molding compound, a laminate or a casing. The encapsulation material may partially encapsulate the component carrier and completely encapsulate the component. The encapsulation material may completely or partially encapsulate the wires and/or the conductive clips.

The encapsulation material may comprise thermosetting materials such as an epoxy, polyimide, polyurethane or polyacryliate compound. Alternatively the encapsulation material may comprise thermoplastic materials such as polysulfones, polyphenylen sulfides, or polyetherimides. In one embodiment the encapsulation material may be a laminate such as a prepreg.

In an optional step the encapsulated component is separated, singulated or cut from other encapsulated components. For example, a plurality of components are placed on a leadframe, bonded and then encapsulated. The leadframe and the encapsulation material are cut with a dicing saw or a dicing laser forming individual encapsulated components.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    placing a wafer on a dicing foil;
    separating the wafer into chips, the chips are separated by spaces;
    after separating, placing a connection layer on the wafer;
    stretching the dicing foil thereby separating the connection layer; and
    picking up the chips from the dicing foil.

2. The method according to claim 1, further comprising pre-curing the connection layer.

3. The method according to claim 2, wherein pre-curing the connection layer comprises pre-curing the connection layer with a temperature between about 80° C. and about 150° C.

4. The method according to claim 1, wherein placing the connection layer on the wafer comprises using a transfer foil in order to place the connection layer on the wafer and removing the transfer foil thereby leaving the connection layer on the wafer.

5. A method of manufacturing a chip, the method comprising:
    placing a wafer on a dicing foil, wherein the wafer comprises a front side and a back side, and wherein the wafer is placed with the front side on the dicing foil;
    dicing the wafer forming gaps and chips;
    forming a photoresist on the wafer;
    patterning the photoresist such that the photoresist remains on the gaps;
    forming a connection layer on the wafer;
    removing the remaining photoresist; and
    picking up the chips from the dicing foil.

6. The method according to claim 5, wherein forming the connection layer comprises sputtering a solder diffusion layer comprising gold tin (AuSn), copper tin (CuSn) or silver tin (AgSn).

7. The method according to claim 5, wherein forming the connection layer comprises electroplating a solder diffusion layer comprising gold tin (AuSn), copper tin (CuSn) or silver tin (AgSn).

8. A method of manufacturing a packaged component, the method comprising:
    placing a wafer on a dicing foil;
    separating the wafer into components, the components separated by spaces;
    after separating, placing an conductive connection layer on the wafer;
    picking up a component from the dicing foil;
    placing the component on a component carrier;
    bonding a first contact pad of the component to a first component carrier contact pad; and
    encapsulating the component.

9. The method according to claim 8, wherein placing the conductive connection layer on the wafer comprises placing a solder paste on the wafer.

10. The method according to claim 8, wherein placing the conductive connection layer on the wafer comprises placing an adhesive conductive paste on the wafer.

11. The method according to claim 8, wherein placing the conductive connection layer on the wafer comprises placing a conductive nano paste on the wafer.

12. The method according to claim 8, wherein placing the conductive connection layer on the wafer comprises forming a photoresist on the wafer, patterning the photoresist such that the photoresist remains on the spaces, forming the conductive connection layer, and removing the remaining photoresist.

13. A method of manufacturing a component, the method comprising:
    dicing a carrier in a plurality of components, the carrier being disposed on a support carrier;
    after dicing, placing a transfer carrier on the diced carrier thereby placing a connection layer on the diced carrier;
    removing the transfer carrier;
    after removing the transfer carrier, separating the connection layer; and
    removing the components from the support carrier.

14. The method according to claim 13, wherein placing the connection layer on the diced carrier comprises placing a component attach paste on the diced carrier.

15. The method according to claim 14, wherein the component attach paste comprises an adhesive conductive paste.

16. The method according to claim 14, further comprising pre-curing the component attach paste.

17. The method according to claim 14, wherein the component attach paste comprises a solder paste.

18. The method according to claim 14, wherein the component attach paste comprises a conductive nano paste.

19. The method according to claim 1, wherein the connection layer comprises a solder paste, an adhesive conductive paste or a conductive nano paste.

20. The method according to claim 5, wherein the connection layer is a solder layer.

* * * * *